United States Patent [19]
Moreland et al.

[11] Patent Number: 6,163,290
[45] Date of Patent: Dec. 19, 2000

[54] LINEARIZING STRUCTURES AND METHODS FOR UNITY-GAIN FOLDING AMPLIFIERS

[75] Inventors: Carl W. Moreland, Oak Ridge; Michael R. Elliott, Greensboro, both of N.C.

[73] Assignee: Analog Devices, Inc., Norwood, Mass.

[21] Appl. No.: 09/352,829

[22] Filed: Jul. 13, 1999

[51] Int. Cl.[7] .................................................. H03M 1/12
[52] U.S. Cl. .......................................... 341/155; 341/161
[58] Field of Search ................................... 341/155, 156; 330/252, 253; 327/560, 561

[56] References Cited

U.S. PATENT DOCUMENTS

| | | | |
|---|---|---|---|
| 5,004,986 | 4/1991 | Bohrer | 330/257 |
| 5,175,550 | 12/1992 | Kattmann et al. | 341/159 |
| 5,384,569 | 1/1995 | Komatsu | 341/159 |
| 5,455,584 | 10/1995 | Taddiken | 341/200 |
| 5,550,492 | 8/1996 | Murden et al. | 327/65 |
| 5,554,943 | 9/1996 | Moreland | 327/65 |
| 5,684,419 | 11/1997 | Murden et al. | 327/104 |
| 5,696,511 | 12/1997 | Matsumoto et al. | 341/161 |
| 5,719,578 | 2/1998 | Böhme | 341/161 |
| 5,835,047 | 11/1998 | Vorenkamp et al. | 341/156 |

OTHER PUBLICATIONS

Kester, Walt, et al., *High Speed Design Techniques,* Analog Devices, Inc., Norwood, MA., 1996, pp. 4–36 to 4–47.

*Primary Examiner*—Michael Tokar
*Assistant Examiner*—Steven S. Paik
*Attorney, Agent, or Firm*—Koppel & Jacobs

[57] ABSTRACT

Linearized unity-gain folding amplifiers include first and second differential pairs of transistors that have offset voltages between control terminals and first current terminals. The control terminals are differentially coupled through input paths to a differential input port and the joined first current terminals receive respective first and second currents through respective first and second level-shift resistors. Thus, folded and level-shifted signals can be differentially coupled via output paths between the first and second level-shift resistors and an output port. For each of the differential pairs, at least one correction voltage is generated to substantially match the offset voltage of one of the transistors of that differential pair when a differential input voltage has one polarity and the offset voltage of another of the transistors when the differential input voltage has a different polarity. The correction voltage is inserted in one of the input paths in a feedback mode of the invention and in one of the output paths in a feed-forward mode and the correction voltage is oriented to correct variations in the offset voltages of one of the differential pairs that occur adjacent a polarity transition of the differential input voltage. In serial arrangements of these amplifiers, their high linearity enhances the quantization processes of successive stages so that longer serial arrangements can be reliably used.

24 Claims, 6 Drawing Sheets

LINEARIZING STRUCTURES AND METHODS FOR UNITY-GAIN FOLDING AMPLIFIERS

BACKGROUND OF THE INVENTION

1. Field of the Invention

The present invention relates generally to analog-to-digital converters (ADCs) and more particularly to folding amplifiers.

2. Description of the Related Art

Single-bit ADCs quantize an analog input signal to a digital output signal that consists of one binary bit. Although useful in themselves, they also serve as building blocks for constructing more complex ADC structures (e.g., serial ADCs and subranging ADCs) in which they are typically positioned in a serial arrangement of ADC stages. The terminal ADC in such an arrangement can generally be a simple comparator but preceding stages must process the input analog signal and pass it to successive stages for further quantization.

An exemplary preceding single-bit stage comprises an amplifier, a subtracter and a comparator that drives a single-bit digital-to-analog converter (DAC) in the form of a switch. The amplifier and the comparator are coupled to the analog input signal and the output of the single-bit DAC is subtracted from the amplifier's output signal in the subtracter to produce a residue analog signal that is passed to a successive ADC stage.

For one polarity of the input signal, the residue signal equals the amplified input signal less a first analog signal from the DAC. For the other polarity of the input signal, the residue signal equals the amplified input signal less a second analog signal from the DAC.

Accordingly, the residue signal contains two linear regions separated by a discontinuity equal to the difference between the first and second analog signals. The discontinuity occurs at the input signal's polarity transition. The gain of the amplifier is typically configured with a gain of two so as to maintain a constant signal range between the input and output. However, successful operation of a serial arrangement of these single-bit stages is significantly degraded by transients that are generated by each stage's discontinuity.

The discontinuity and resultant transient production of the foregoing single-bit structure are avoided by substitution of folding amplifiers which have a positive gain for one polarity of input signal and a negative gain for the other polarity. The output signal is generally level-shifted to facilitate signal quantization in a successive folding amplifier.

An exemplary unity-gain folding amplifier is disclosed in U.S. Pat. No. 5,550,492 issued Aug. 27, 1996 to Frank Murden and assigned to Analog Devices, Inc., the assignee of the present invention. This amplifier includes complimentary differential pairs of transistors which perform the folding process and current sources which are coupled through respective resistors to respective differential pairs to perform the level-shifting process.

Because of its simplicity and because the input signal is only processed through current conversion structures (i.e., base-emitter junctions), this folding amplifier is generally smaller, less expensive, more efficient and faster than adjustable-gain folding amplifier structures. The unity gain of this structure, however, causes its output signal range to be halved from its input signal range. When necessary, therefore, to keep the signal range above an operational limit, one or more initial stages of a serial arrangement of ADC stages can be formed with the adjustable-gain folding amplifier structures.

However, any linearity degradation of this unity-gain folding amplifier prevents a full realization of its advantages because such degradation complicates quantization in successive stages and limits the number of unity-gain folding amplifier that can be reliably operated in a serial arrangement.

SUMMARY OF THE INVENTION

The present invention is directed to structures and methods of linearized unity-gain folding amplifiers. In a serial arrangement of these amplifiers, their high linearity enhances the quantization processes of successive stages so that longer serial arrangements can be reliably used. The invention therefore permits a more extensive realization of the size, cost, efficiency and speed advantages of these amplifiers.

The invention provides first and second differential pairs of transistors that have offset voltages between control terminals and first current terminals. The control terminals are differentially coupled through input paths to a differential input port and the joined first current terminals receive respective first and second currents through respective first and second level-shift resistors. Thus, folded and level-shifted signals can be differentially coupled via output paths between the first and second level-shift resistors and an output port.

For each of the differential pairs, the invention generates at least one correction voltage that substantially matches the offset voltage of one of the transistors of that differential pair when a differential input voltage has one polarity and the offset voltage of another of the transistors when the differential input voltage has a different polarity. The correction voltage is inserted in one of the input paths in a feedback mode of the invention and in one of the output paths in a feed-forward mode. Finally, the correction voltage is oriented to correct variations in the offset voltages of a respective one of the differential pairs that occur adjacent a polarity transition of the differential input voltage.

In an embodiment, the invention directs a correction current through a base-emitter junction with an amplitude that corresponds to a current through one of the transistors of a respective one of the differential pairs when the differential input voltage has one polarity and to a current through another of the transistors when the differential input voltage has a different polarity. The base-emitter junction is then inserted in one of the input paths or in one of the output paths.

The novel features of the invention are set forth with particularity in the appended claims. The invention will be best understood from the following description when read in conjunction with the accompanying drawings.

DETAILED DESCRIPTION OF THE PREFERRED EMBODIMENTS

Figure 1:
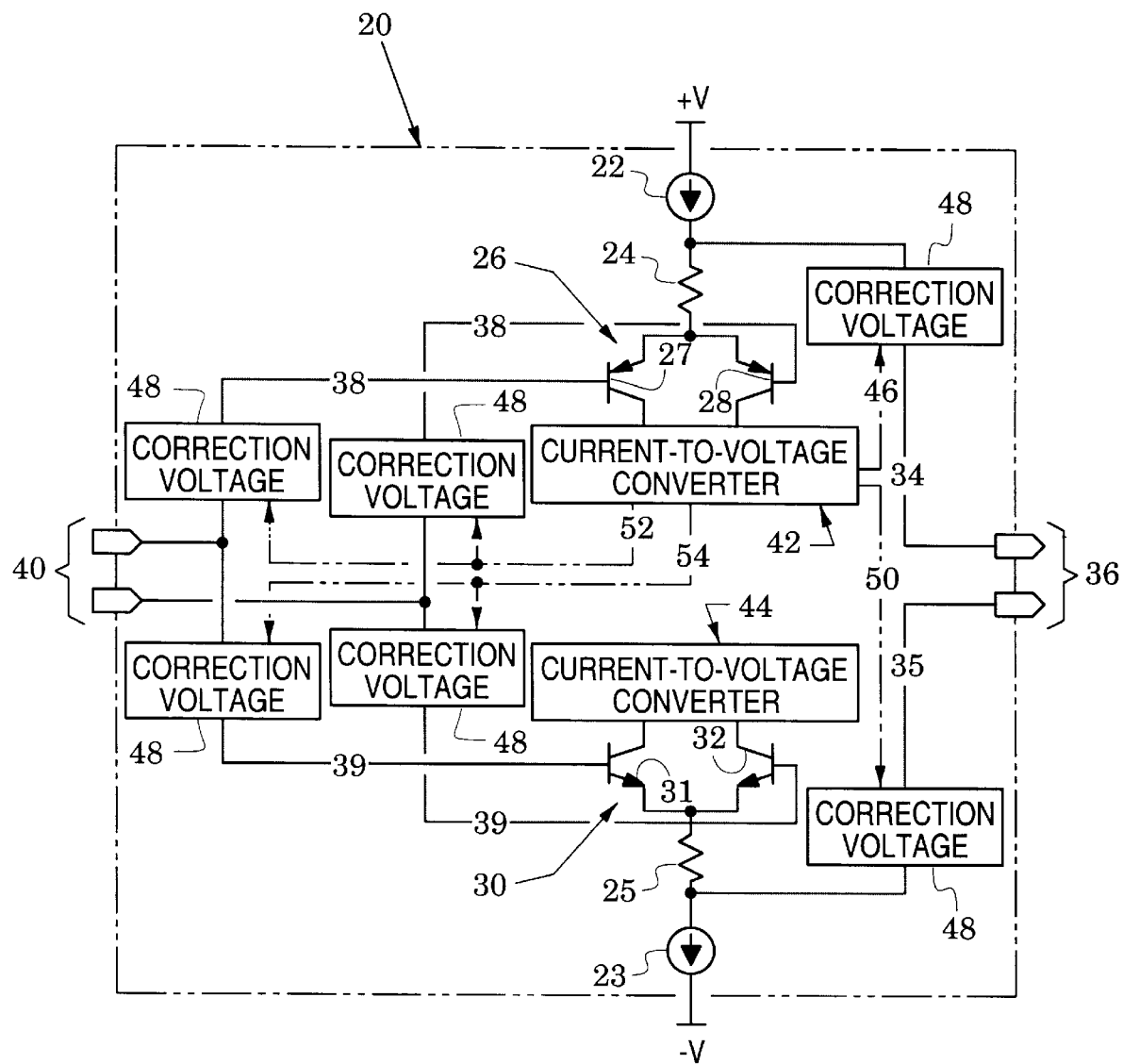
FIG. 1 is a schematic of a unity-gain folding amplifier of the present invention.

FIG. 1 illustrates a unity-gain folding amplifier 20 whose simple structure enhances its speed and reduces its size, power consumption and cost. The amplifier includes current-to-voltage converters that insert correction voltages in input and output signal paths to improve the amplifier's linearity and thereby enhance and increase its application in various ADC structures (e.g., serial ADCs and subranging ADCs).

In particular, the folding amplifier 20 has first and second current sources 22 and 23, first and second level-shift resistors 24 and 25, a first differential pair 26 of transistors 27 and 28 and a second differential pair 30 of transistors 31 and 32. First ends of the resistors are coupled to respective ones of the current sources and are also differentially coupled through differential output paths 34 and 35 to a differential output port 36. Emitters of the differential pairs 26 and 30 are joined to second ends of respective resistors 24 and 25 and bases of the differential pairs are coupled through differential input signal paths 38 and 39 to a differential input port 40.

The polarity of transistors 27 and 28 is opposite that of transistors 31 and 32. Because these transistors have offset voltages (i.e., their base-emitter voltages $V_{BE}$) between their bases and emitters, these offset voltages are inserted between differential input voltages at the input port output 40 and differential output voltages at the output port 38. It has been found that these offset voltages vary adjacent a polarity transition of the differential input voltage and this variation degrades amplifier linearity.

Accordingly, the folding amplifier 20 also includes current-to-voltage converters 42 and 44 that each receive currents from collectors of a respective differential pair and generate at least one correction voltage which they insert in one of the input and output paths.

A feed-forward process is exemplified in FIG. 1 by the broken insertion arrow 46 which indicates that a correction voltage 48 of the current-to-voltage converter 42 is inserted in the output signal path 34. Alternatively, the broken insertion arrow 50 indicates that the correction voltage 48 is inserted in the output signal path 35. A feedback process is exemplified by the broken insertion arrow 52 which indicates that the correction voltage 48 is inserted in both of the input signal paths 38 and the broken insertion arrow 54 indicates that the correction voltage 48 is inserted in both of the input signal paths 39.

The correction voltage varies in a manner similar to that of the offset voltage and is oriented to oppose and reduce the offset variations. To enhance a further understanding of this linearizing process, a detailed description of the process is preceded by the following description of a feed-forward embodiment.

Figure 2:
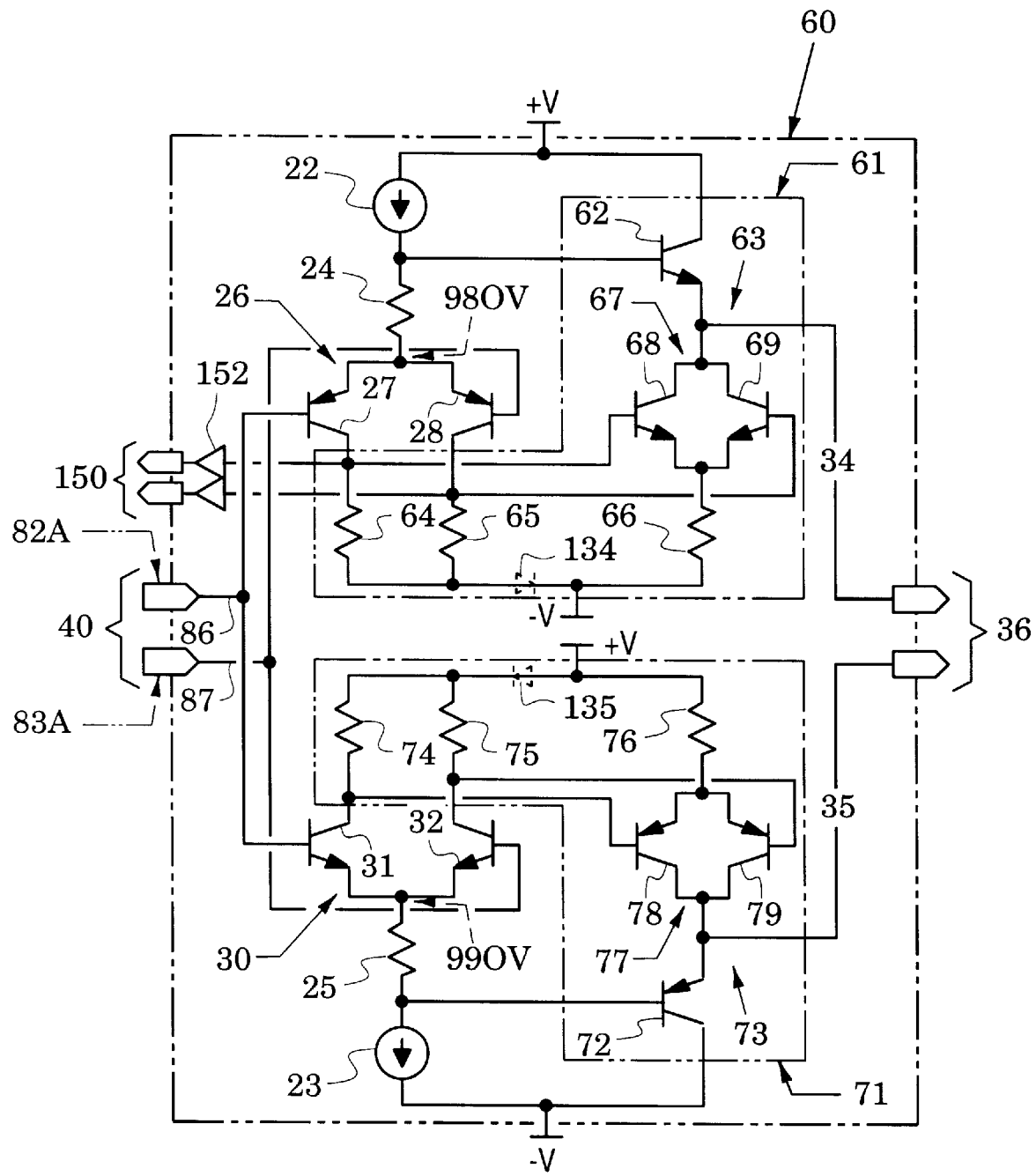
FIG. 2 is a schematic of a feed-forward embodiment of the folding amplifier of FIG. 1.

FIG. 2 shows a folding amplifier 60 that is similar to portions of the folding amplifier 20 of FIG. 1 with like elements indicated by like reference numbers. In the folding amplifier 60, a first current-to-voltage converter 61 includes a correction transistor 62 and a current converter 63 that is formed with first, second and third resistors 64, 65 and 66 and a correction differential pair 67 of transistors 68 and 69. The joined emitters of the differential pair 67 are coupled to the resistor 66 and collectors of the differential pair are joined to the emitter of the correction transistor 62.

The first and second resistors 64 and 65 receive currents from collectors of the differential pair 26 and convert them to voltages that bias the bases of the transistors 68 and 69. In response, these transistors generate correction currents which flow through the correction transistor 62 which is arranged with its base-emitter junction across the output path 34.

The second current-to-voltage converter 71 includes a correction transistor 72 and a current converter 73 that is formed with first, second and third resistors 74, 75 and 76 and a correction differential pair 77 of transistors 78 and 79. The second current-to-voltage converter 71 operates in a manner similar to that of the first current-to-voltage converter 61.

Figure 3A:
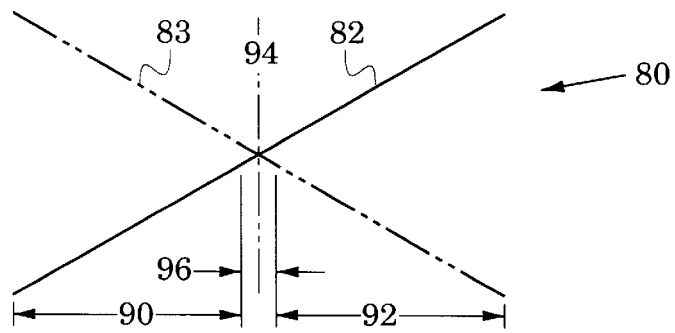
FIGS. 3A–3F illustrate linearization processes of the folding amplifier of FIG. 2.

Operation of the folding amplifier 60 is further explored in the diagram 80 of FIG. 3A which shows a continuum of differential input voltages 82 and 83 that are inserted at the differential input port (40 in FIG. 2). As is also indicated by a broken application arrow 82A in FIG. 2, input voltage 82 is applied to the upper side (86 in FIG. 2) of the input port and ranges linearly upward from a minimum at the left side of FIG. 3 to a maximum at the right side. As is also indicated by a broken application arrow 83A in FIG. 2, the input voltage 83 is applied to the lower side (87 in FIG. 2) of the input port and has a slope that is reversed from that of the input voltage 82.

To simplify the following description, it will be helpful to address the polarity of the differential input voltage and divide it into three regions. In a first polarity region 90, the input voltage 83 is much greater than the input voltage 82 and in a second polarity region 92, the input voltage 82 is much greater than the input voltage 83. At a polarity transition 94, the input voltages are equal and they are nearing equality in a third polarity region 96 that includes the polarity transition and adjacent regions.

Figure 3B:
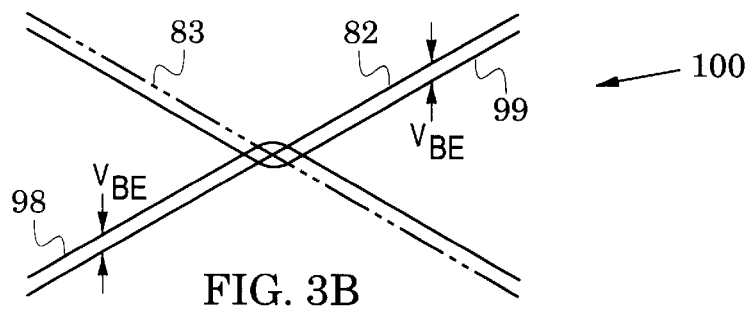

In the first polarity region 90, transistor 27 of FIG. 2 carries the current of the current source 22 so that an offset voltage 98 at the joined emitters of the differential pair 26 (indicated in FIG. 2 by a broken offset voltage arrow 980V) is offset above the input voltage 82 by a base-emitter voltage $V_{BE}$ as shown in the diagram 100 of FIG. 3B. In the second polarity region, transistor 28 of FIG. 2 carries the current of the current source 22 so that the offset voltage 98 is now offset above the input voltage 83 by the base-emitter voltage $V_{BE}$ as shown in FIG. 3B.

The second differential pair 30 of FIG. 2 responds to the input voltages in a similar manner but because its base-emitter junctions are reversed from those of the first differential pair, an offset voltage 99 at the joined emitters of the differential pair 30 (indicated in FIG. 2 by a broken offset voltage arrow 99OV) is spaced below the input voltages 82 and 83 by a base-emitter voltage $V_{BE}$ as shown in FIG. 3B.

Figure 3C:
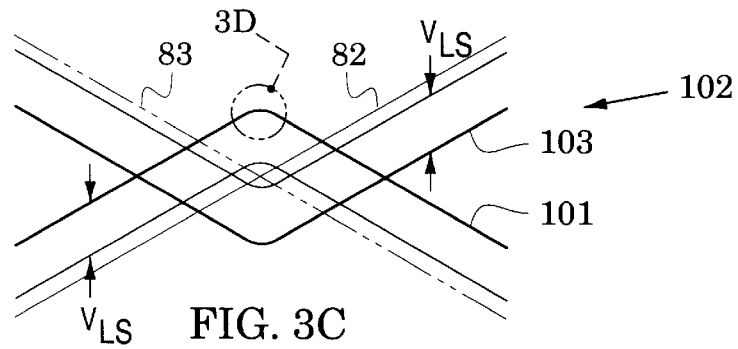

The current of the current source 22 of FIG. 2 generates a level-shift voltage $V_{LS}$ as it flows through the level-shift resistor 24 so that a level-shifted voltage 101 is generated as shown in the diagram 102 of FIG. 3C and this level-shifted voltage appears on the output path 34 of FIG. 2.

Similarly, the current of the current source 23 of FIG. 2 generates a level-shift voltage $V_{LS}$ as it flows through the level-shift resistor 25 so that a level-shifted voltage 103 is generated as shown in FIG. 3C and this level-shifted voltage appears on the output path 35 of FIG. 2.

In this initial operational phase of the folding amplifier 60 of FIG. 2, the amplifier's gain has one sign for one input voltage polarity and the opposite sign for the other input voltage polarity, i.e., the input voltage has been folded. In addition, the folded voltages have been level-shifted so that a folded, level-shifted output voltage appears on the output paths 34 and 35. This operation of the folding amplifier 60 is of significant value in forming various ADC structures such as those shown in FIGS. 5 and 6. However, this value is lessened if the linearity of the folding and level-shifting operation is degraded.

Figure 3D:
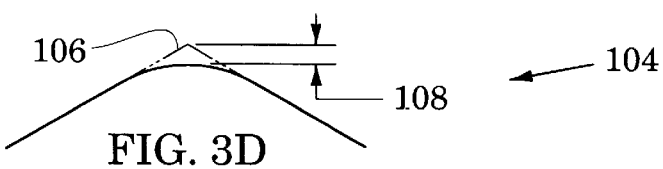

FIG. 3D is an expanded view 104 of the region indicated in FIG. 3C by a broken circle 3D. This view shows that the level-shifted voltage 101 departs from a folded linear waveform 106 by an error 108. It has been determined that this error has an origin that involves the relationship between base-emitter voltages and collector currents in the differential pair 26 of FIG. 2. As shown by various references (e.g., Gray, Paul R. et al., *Analysis and Design of Analog Integrated Circuits*, John Wiley and Sons, New York, 1993, p. 13), this relationship is given by $$V_{BE} = V_T \ln \frac{I_C}{I_S} \quad (1)$$

in which $V_T$ is the thermal voltage, $I_C$ is collector current and $I_S$ is a constant associated with a transfer characteristic of transistors in their forward-biased regions.

In the polarity regions 90 and 92 of FIG. 3A, the transistors 27 and 28 respectively carry a collector current of $I_{CS}$ that is the current of the current source 22 of FIG. 2. At the polarity transition 94, however, both transistors are on so that they each carry a current of $I_{CS}/2$ and accordingly, they each have a base-emitter voltage of $$V_{BE} = V_T \ln \frac{\left(\frac{I_C}{2}\right)}{I_S}. \quad (2)$$

The error 108 of FIG. 3D is thus the difference between equations (1) and (2) which is $$\Delta V_{BE} = V_T \ln 2 \sim 18 \text{ millivolts.} \quad (3)$$

The polarity region 96 of FIG. 3A represents a region in which the transistors 27 and 28 are beginning to turn on and off so that the level-shifted voltage 101 smoothly transitions between a linear waveform and the maximum error 108 at the polarity transition 94 as indicated in FIGS. 3C and 3D.

In the current-to-voltage converter 61 of FIG. 2, the base-emitter junction of correction transistor 62 is inserted in the output path 34. The current converter 63 receives the currents of transistors 27 and 28 with the first and second resistors 64 and 65. In the first polarity region 90 of FIG. 3A, all of the current of current source 22 flows through resistor 64 and the resultant voltage less the $V_{BE}$ drop of transistor 68 appears across the third resistor 66. In the second polarity region 92 of FIG. 3A, all of the current of current source 22 flows through resistor 65 and the resultant voltage less the $V_{BE}$ drop of transistor 69 appears across the third resistor 66.

Figure 3E:
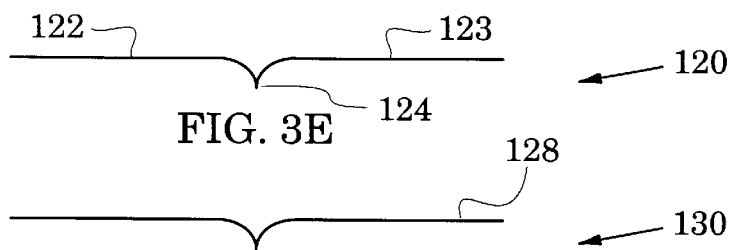

The voltage at the coupled emitters of the differential pair 67 thus appear as flat lines 122 and 123 in the diagram 120 of FIG. 3E. At the polarity transition 94 of FIG. 3A, one half of the current of current source 22 flows through each of the resistors 64 and 65 so that the voltage at the coupled emitters of the differential pair 67 is substantially halved as indicated by the dip 124 in FIG. 3E.

Figure 3F:
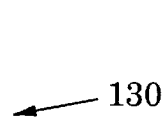

Because the voltage waveform of FIG. 3E appears across the resistor 66 and because the collectors of the differential pair 67 are joined, the current delivered to the correction transistor 62 has the waveform 128 of the diagram 130 of FIG. 3F wherein this current waveform has the same shape as the voltage waveform of FIG. 3E.

The current through the correction transistor 62 thus has substantially the same waveform as the current through the transistors 27 and 28 of the first differential pair 26. Accordingly, the voltage $V_{BE}$ across the base-emitter junction of the correction transistor 62 is substantially defined by equation (1) in polarity regions 1 and 2 of FIG. 3A and by equation (2) at the polarity transition 94 and thus substantially duplicates the error of equation (3). Because the base-emitter junction of the correction transistor 62 is oriented so that its $V_{BE}$ opposes that of transistors 27 and 28, the correction transistor substantially corrects the error 108 of FIG. 3D.

This error can be further reduced by introducing a diode 134 (shown in broken lines) in series with resistors 64 and 65 to match the base-emitter drops of transistors 68 and 69. If the resistors 64, 65 and 66 are chosen to have the same resistance, the transistors 27, 28, 62, 68 and 69 and the diode 134 are preferably realized with similar-size devices.

In a summary of the operational description above, it can be stated that the current-to-voltage converter 61 receives currents from the collectors of the differential pair 26 and inserts a correction voltage in the output path 34 that substantially matches the offset voltage of the transistor 27 across all of the polarity regions 90, 92 and 96 of FIG. 3A. The correction voltage is oriented so as to correct the voltage variations of the differential pair 26.

It can be further stated that the correction voltage is realized with a correction transistor that has its base-emitter junction inserted in the output path 34 and the correction transistor receives its current from a current converter 63 that directs a correction current through the base-emitter junction that corresponds to a current in the transistor 28 when the differential input voltage at input port 40 of FIG. 2 has one polarity and corresponds a current in transistor 27 when the differential input voltage has a different polarity. The current-to-voltage converter 71 operates similarly to the current-to-voltage converter 61 except that its transistors and an included diode 135 are of opposite polarity.

Figure 4:
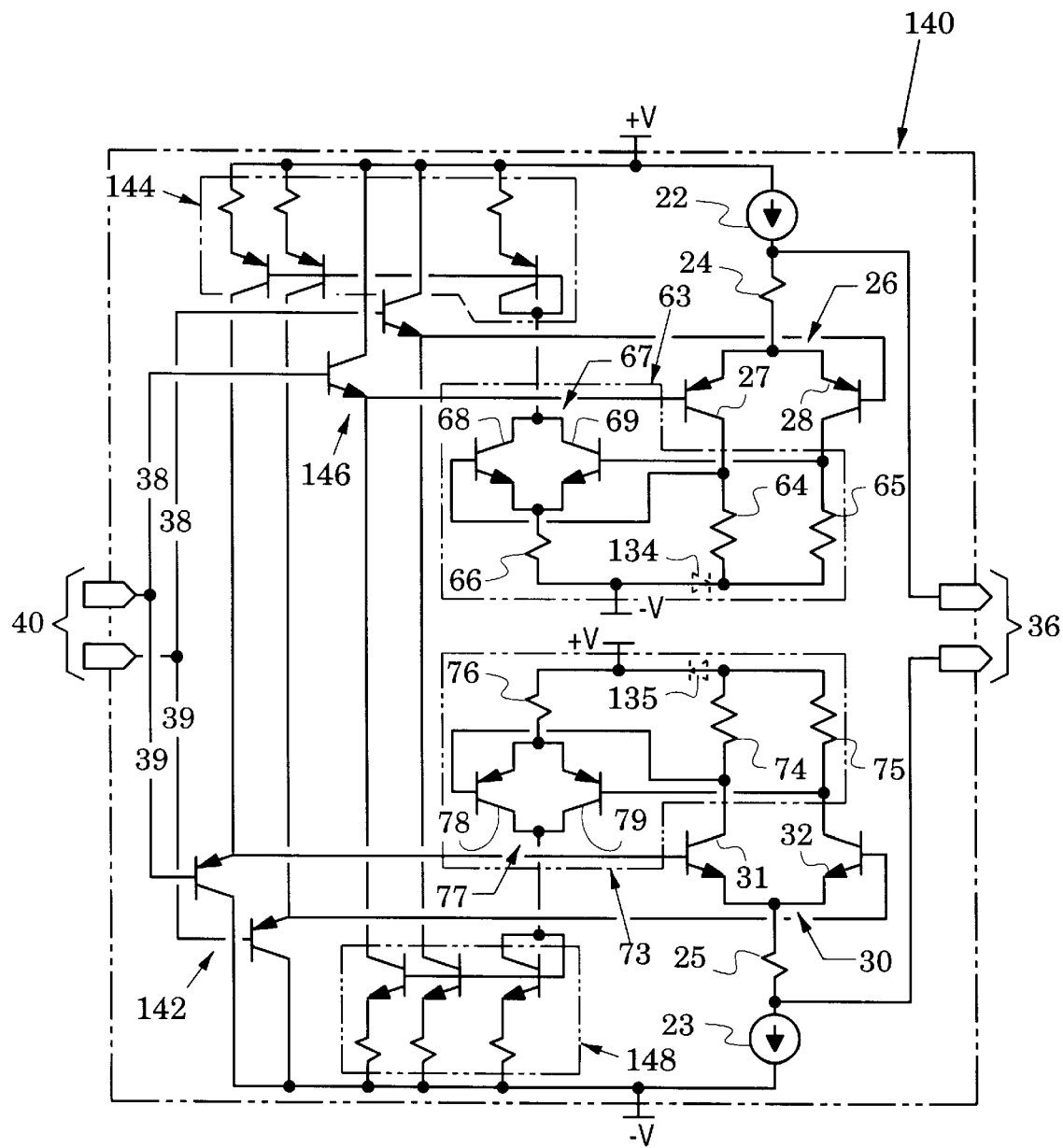
FIG. 4 is a schematic of a feedback embodiment of the folding amplifier of FIG. 1.

FIG. 4 illustrates a folding amplifier 140 that is similar to portions of the folding amplifier 60 of FIG. 2 with like elements indicated by like reference numbers. In contrast to that folding amplifier however, the folding amplifier 140 is a feedback embodiment of the folding amplifier 20 of FIG. 1.

Therefore, the current-to-voltage converter 61 of FIG. 2 is modified to position its correction transistors in the input paths 38 and 39 that are indicated in FIGS. 1 and 4. In FIG. 4, this modification comprises two steps. In the first step, dual opposite-polarity correction transistors 142 are substituted for the correction transistor 62 of FIG. 2 and positioned in the input paths 39. In the second step, a current mirror 144 is coupled to receive the correction current from the current converter 63 (in particular, from the differential pair 67) and pass mirrored versions of that current through the correction transistors 142.

It is noted that the dual correction transistors 142 generally accomplish the same objective as the correction transistor 72 of FIG. 2 (i.e., correction of errors associated with the second differential pair 30) but they receive correction currents from the current converter 63 rather than from current converter 73.

In a similar manner, the current-to-voltage converter 71 of FIG. 2 is modified by substituting dual opposite-polarity correction transistors 146 for the correction transistor 72 of FIG. 2 and positioning them in the input paths 38. A current mirror 148 is coupled to receive the correction current from the current converter 73 (in particular, from the differential pair 77) and pass mirrored versions of that current through the correction transistors 146.

It is noted that the dual correction transistors 146 generally accomplish the same objective as the correction transistor 62 of FIG. 2 (i.e., correction of errors associated with the first differential pair 26) but they receive correction currents from the current converter 73 rather than from current converter 63.

The invention's linearized folding amplifiers are particularly suited for forming various ADC structures. In this use, each folding amplifier typically forms a stage of a multistage ADC and accordingly, it also generates a differential output signal that indicates the digital output bit of that stage. This differential signal can be provided by either of the first and second differential pairs (26 and 30 in FIG. 1) and can be delivered through various conventional structures. For example, FIG. 2 indicates a bit output port 150 that receives signals through buffers 152 from the collectors of the differential pair 26. The buffers can be formed to deliver differential voltage signals (e.g., they can be emitter followers) or differential current signals (e.g., they can be current mirrors) to indicate the output bit.

Figure 5:
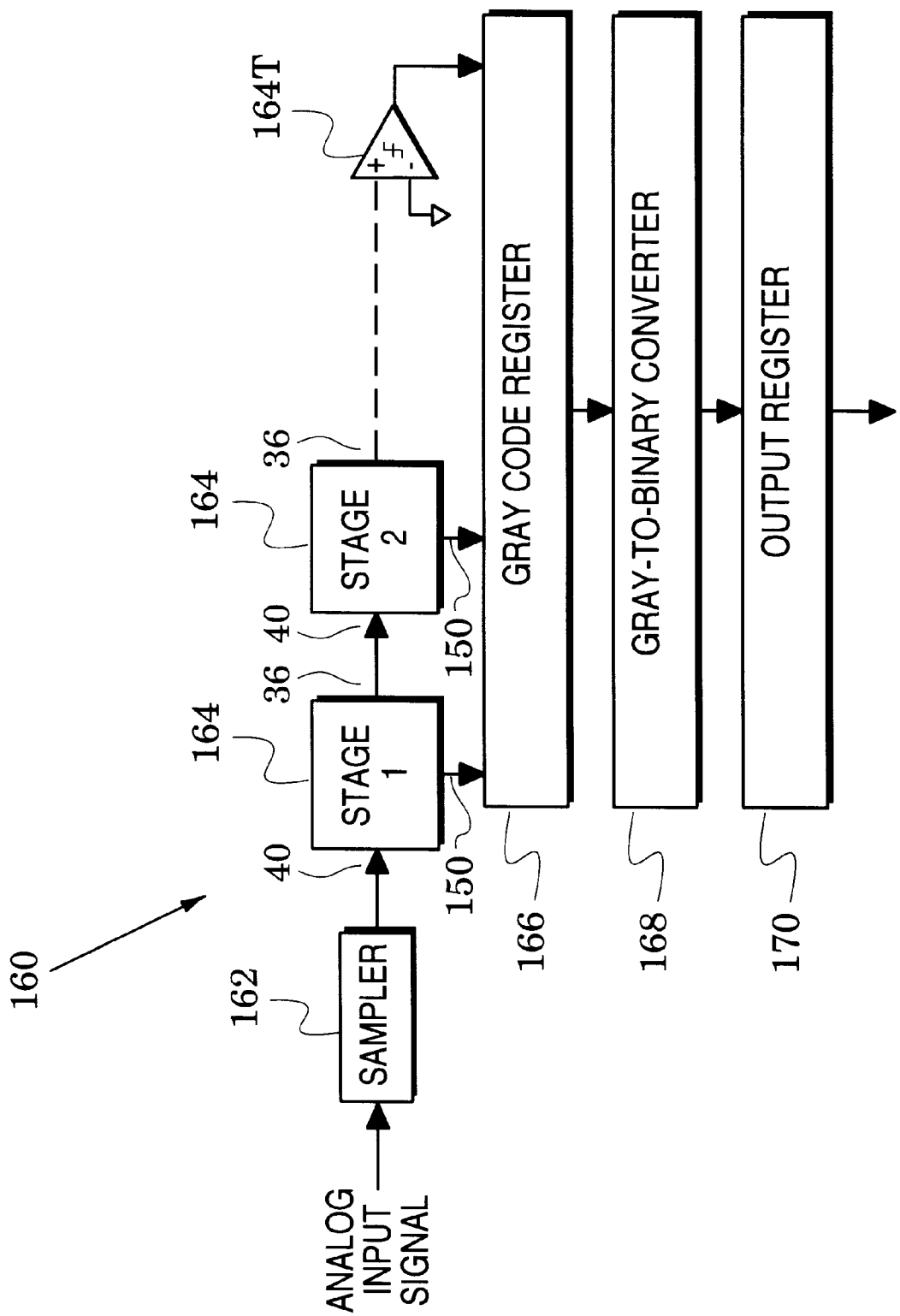
FIG. 5 is a block diagram of a series ADC that includes the folding amplifier of FIG. 1.

As shown in FIG. 5, a serial N-bit ADC 160 receives an analog signal with a sampler 162 (e.g., a sample and hold circuit) which feeds N serially-connected single-bit ADC stages 164. Because no further signal processing is needed after a terminal quantization, a terminal stage 164T is a simple comparator 164 with one or all of the remaining stages formed with the folding amplifier 20 of FIG. 1 with its correction voltages positioned in either the feed-forward mode (as exemplified in FIG. 2) or the feedback mode (as exemplified in FIG. 4).

Each of these latter stages receives a differential input at its input port 40 and delivers a folded and level-shifted output at its output port 36. Each stage outputs a bit signal at its bit output 150 (as exempified in FIG. 2). The comparator 164T may be one of the differential pairs 26 and 30 of the folding amplifier 20 of FIG. 1.

Because of the folding process (e.g., as shown in FIG. 3B), folding amplifiers reverse the order of every other set of digital output bits so that they provide a Gray code rather than a binary code. Accordingly, the output bits of the ADC stages of FIG. 5 are initially collected in a Gray code register 166 and then preferably converted in a Gray-to-binary converter 168 before passing through an output register 170.

Figure 6:
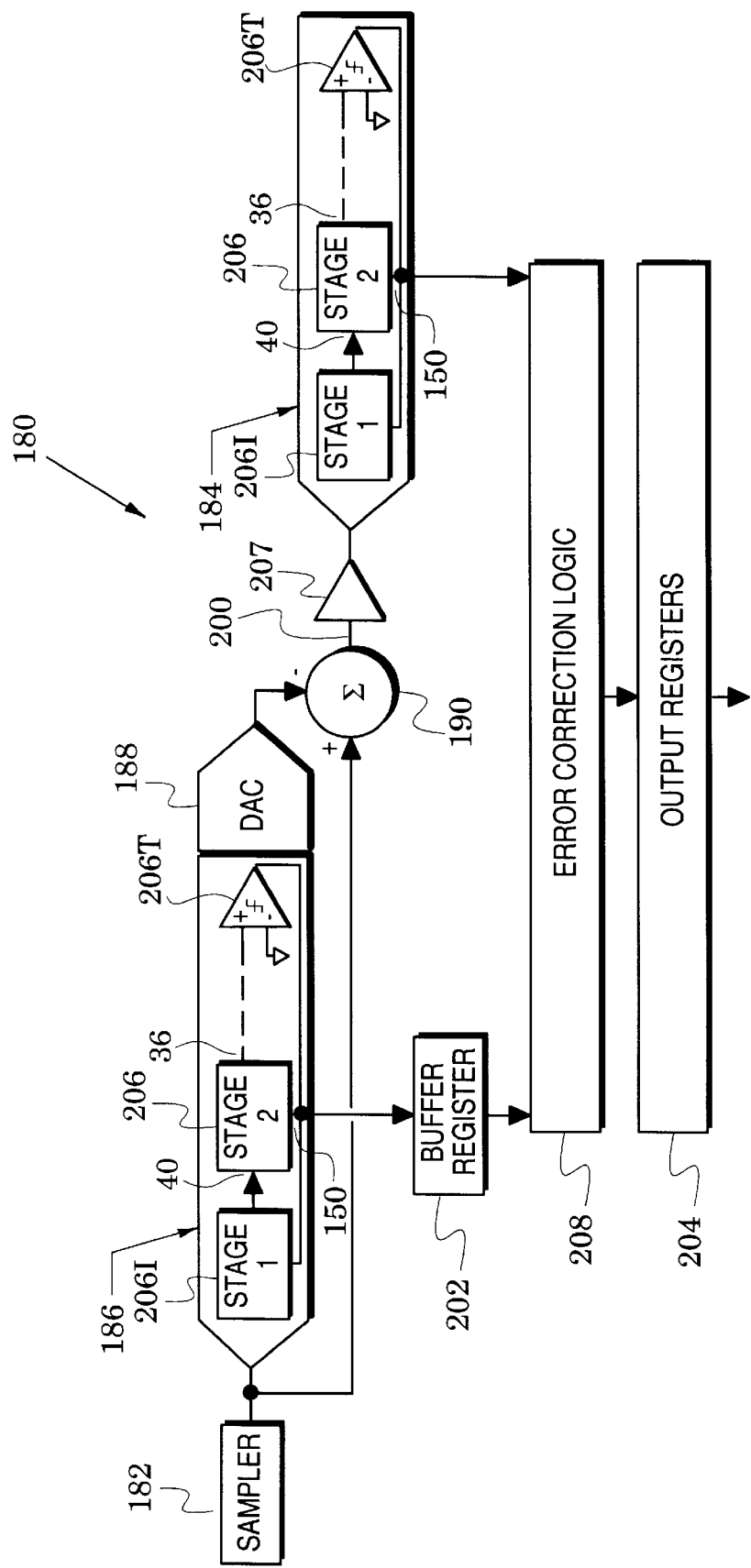
FIG. 6 is a block diagram of a subranging ADC that includes the folding amplifier of FIG. 1.

FIG. 6 illustrates a K-bit subranging ADC 180 that includes a sampler 182 and a terminal N-bit serial ADC 184 that is preceded by an M-bit serial ADC 186. The digital output of the serial ADC 186 is coupled through a matching M-bit DAC 188 whose analog output is subtracted in a subtracter 190 from the output of the sampler to form a residue signal 200 which is quantized by the serial ADC 184. The converted bits from the serial ADC 186 are preferably held in buffer registers 202 before all converted bits are collected in output registers 204.

Similar to the serial ADC 160 of FIG. 5, the serial ADCs 184 and 186 have N and M stages 206 respectively with a terminal stage 206T in each ADC being a simple comparator. At least one of the other stages in each ADC is realized with the folding amplifier 20 of FIG. 1 with its correction voltages positioned in either the feed-forward mode or the feedback mode. Each of these latter stages receives a differential input at its input port 40 and delivers a folded and level-shifted output at its output port 36 and each stage outputs a bit signal at its bit output 150.

It is noted from FIGS. 3A–3C that folding amplifiers of the invention have unity gain (their output and input signal slopes are identical) so that the output signal range is halved from the input signal range because of the amplifier's folding and level-shifting processes. Accordingly, the input signal range of a long string of unity-gain folding amplifiers can be reduced below a level that is considered adequate for reliable quantization.

Folding amplifiers that have nonlinear transfer functions degrade the quantization processes of subsequent folding amplifiers and thus nonlinearities further reduce the number of folding amplifiers that can be reliably arranged in a serial ADC.

The improved linearity of the folding amplifier of FIG. 1 is therefore a significant feature of the present invention as it permits an increase in the number of these folding amplifiers that can reliably comprise a serial ADC. Thus the invention facilitates a fuller realization of the speed, size, power consumption and cost advantages of these folding amplifiers.

For a large value of M, however, at least an initial ADC stage 206I of the serial ADC 186 is preferably one of various conventional adjustable-gain folding amplifiers (e.g., as taught in U.S. Pat. No. 5,684,419 issued Nov. 4, 1997 to Frank Murden, et al.). These stages can be set, for example, to achieve a gain of two so that there is no decrease of input signal range in a successive folding amplifier.

The input signal range of the serial ADC 184 is preferably restored to approximate that of the preceding serial ADC 186 and accordingly, a linear amplifier 207 having sufficient gain (e.g., on the order of $2^5$ when M is 5) is typically inserted to amplify the residue signal 200.

Although the M-bit serial ADC 186 and N-bit serial ADC 184 can be structured with a bit relationship of M+N=K, this arrangement places severe demands on the accuracy and settling time of the preceding ADC 186. These demands are relaxed and overall speed increased with a bit relationship of M+N>K which facilitates a digital error correction process.

In an exemplary arrangement, M and N are both increased one bit over their values in the bit relationship of M+N=K. The A/D and D/A conversions of the serial ADC 186 and DAC 188 may then be performed more quickly with some loss of accuracy because of inadequate settling time. The higher resolution of the serial ADC 184 contains enough data to correct the errors in the initial conversion process and this correction is typically accomplished in a full adder that can be included in the error correction logic 208 of FIG. 6. Although the bit relationship of M+N>K requires a small increase in hardware complexity, it facilitates a significant increase in speed and accuracy.

To further enhance operation of the subranging ADC 180, additional samplers may be inserted in the analog paths before and after the subtracter 190.

The structure of the subranging ADC 180 can be extended with additional preceding ADCs. That is, another serial ADC and matching DAC can be arranged to feed a residue signal to the serial ADC 186 in the same manner that this ADC generates and feeds a residue signal to the serial ADC 184.

Although the invention has been described with reference to bipolar transistors, the teachings of the invention may be practiced with any transistors that have first and second current terminals (e.g., emitters and collectors) that are responsive to control terminals (e.g., bases).

The preferred embodiments of the invention described herein are exemplary and numerous modifications, variations and rearrangements can be readily envisioned to achieve substantially equivalent results, all of which are intended to be embraced within the spirit and scope of the invention as defined in the appended claims.

We claim:

1. A folding amplifier that generates a folded and level-shifted differential output voltage at a differential output port in response to a differential input voltage at a differential input port, comprising:

first and second current sources;

first and second level-shift resistors that have first ends and second ends wherein first ends are coupled to respective ones of said current sources and are differentially coupled through output paths to said differential output port;

first and second differential pairs of transistors that have offset voltages between control terminals and first current terminals wherein said control terminals are differentially coupled through input paths to said differential input port and said first current terminals are joined at the second ends of respective ones of said level-shift resistors; and first and second current-to-voltage converters that each generate at least one correction voltage that substantially matches the offset voltage of one of the transistors of a respective one of said differential pairs when said differential input voltage has one polarity and the offset voltage of another of the transistors when said differential input voltage has a different polarity;

wherein said correction voltage is oriented in at least one of said input paths and said output paths to substantially correct variations in the offset voltages of one of said differential pairs adjacent a polarity transition of said differential input voltage.

2. The folding amplifier of claim 1, wherein said correction voltage is inserted in at least one of said input paths.

3. The folding amplifier of claim 1, wherein said correction voltage is inserted in at least one of said output-paths.

4. The folding amplifier of claim 1, wherein the transistors of said first and second differential pairs are bipolar transistors and each of said current-to-voltage converters includes:

at least one correction transistor having a base-emitter junction inserted in one of said input paths and said output paths; and a current converter that directs a correction current through said base-emitter junction with an amplitude that corresponds to a current amplitude through one of the transistors of a respective one of said differential pairs when said differential input voltage has one polarity and to to a current amplitude through another of the transistors when said differential input voltage has a different polarity.

5. The folding amplifier of claim 4, wherein said current converter includes:

first, second and third resistors coupled to a reference voltage with said first and second resistors coupled to respective second current terminals of a respective one of said first and second differential pairs; and a correction differential pair of transistors that have control terminals coupled to respective second current terminals of a respective one of said first and second differential pairs, that have joined first current terminals coupled to said third resistor and that have joined second current terminals which provide said correction current.

6. A folding amplifier that generates a folded and level-shifted differential output voltage at a differential output port in response to a differential input voltage, comprising:

first and second current sources;

first and second level-shift resistors that have first ends and second ends wherein said first ends are coupled to respective ones of said current sources;

first and second differential pairs of transistors that have offset voltages between control terminals and first current terminals wherein said control terminals are differentially coupled to said differential input port and said first current terminals are joined at the second ends of respective ones of said level-shift resistors; and first and second current-to-voltage converters that each receives first and second currents from second current terminals of a respective one of said differential pairs and inserts a correction voltage between the first end of a respective one of said resistors and a respective side of said differential output port that substantially matches the offset voltage of one of the transistors of that differential pair when said differential input voltage has one polarity and the offset voltage of another of the transistors when said differential input voltage has a different polarity;

wherein said correction voltage is oriented to substantially correct variations in the offset voltages adjacent a polarity transition of said differential input voltage.

7. The folding amplifier of claim 6, wherein the transistors of said first and second differential pairs are bipolar transistors and each of said current-to-voltage converters includes:

a transistor having a base-emitter junction inserted between the first end of a respective one of said resistors and a respective side of said differential output port; and a current converter that directs a correction current through said base-emitter junction that corresponds to said first current when said differential input voltage has one polarity and to said second current when said differential input voltage has a different polarity.

8. The folding amplifier of claim 7, wherein said current converter includes:

first, second and third resistors coupled to a reference voltage with said first and second resistors coupled to respective ones of said second current terminals; and a correction differential pair of transistors that have control terminals coupled to respective ones of said second current terminals, that have joined first current terminals coupled to said third resistor and that have joined second current terminals which provide said correction current.

9. A folding amplifier that generates a folded and level-shifted differential output voltage at a differential output port in response to a differential input voltage, comprising:

first and second current sources;

first and second level-shift resistors that have first ends and second ends wherein said first ends are coupled to respective ones of said current sources and are differentially coupled to said differential output port;

first and second differential pairs of transistors that have offset voltages between control terminals and first current terminals wherein said control terminals are differentially coupled to said differential input port and said first current terminals are joined at the second ends of respective ones of said level-shift resistors; and first and second current-to-voltage converters that each receives first and second currents from second current terminals of a respective one of said differential pairs, generates first and second correction voltages that substantially match the offset voltage of one of the transistors of that differential pair when said differential input voltage has one polarity and the offset voltage of another of the transistors when said differential input voltage has a different polarity and inserts said first and second correction voltages between respective sides of said differential input port and respective control terminals of one of said differential pairs;

wherein said correction voltages are oriented to substantially correct variations in the offset voltages adjacent a polarity transition of said differential input voltage.

10. The folding amplifier of claim 9, wherein the transistors of said first and second differential pairs are bipolar transistors and each of said current-to-voltage converters includes:

first and second transistors that each have a base-emitter junction inserted between a respective side of said differential input port and a respective control terminal; and a current converter that directs a correction current through said base-emitter junction that corresponds to said first current when said differential input voltage has one polarity and to said second current when said differential input voltage has a different polarity.

11. The folding amplifier of claim 10, wherein said current converter includes:

first, second and third resistors coupled to a reference voltage with said first and second resistors coupled to respective ones of said second current terminals; and a correction differential pair of transistors that have control terminals coupled to respective ones of said second current terminals, that have joined first current terminals coupled to said third resistor and that have joined second current terminals which provide said correction current.

12. A method for generating a folded and level-shifted differential output voltage at a differential output port in response to a differential input voltage at a differential input port, comprising the steps of:

providing first and second differential pairs of transistors that have offset voltages between control terminals and first current terminals;

differentially coupling said control terminals through input paths to said differential input port;

receiving first and second currents with first ends of respective first and second level-shift resistors;

differentially coupling said first ends through output paths to said differential output port;

joining said first current terminals to first ends of respective level-shift resistors;

for each of said differential pairs, generating at least one correction voltage that substantially matches the offset voltage of one of the transistors of that differential pair when said differential input voltage has one polarity and the offset voltage of another of the transistors when said differential input voltage has a different polarity; and orienting each correction voltage in one of said input paths and said output paths to substantially reduce variations in the offset voltages of one of said differential pairs adjacent a polarity transition of said differential input voltage.

13. The method of claim 12, wherein each correction voltage is inserted in one of said input paths.

14. The method of claim 12, wherein each correction voltage is inserted in one of said output paths.

15. The method of claim 12, wherein:

said generating step includes the step of directing through a base-emitter junction, a correction current that corresponds to a current through one of the transistors of a respective one of said differential pairs when said differential input voltage has one polarity and to a current through another of the transistors when said differential input voltage has a different polarity; and said orienting step includes the step of inserting said base-emitter junction in one of said input paths and said output paths.

16. A serial analog-to-digital converter, comprising:

a sampler;

a comparator;

at least one unity-gain folding amplifier coupled between said sampler and said comparator in a serial arrangement wherein each folding amplifier has a differential input port and a differential output port and includes:

a) first and second current sources;

b) first and second level-shift resistors that have first ends and second ends wherein first ends are coupled to respective ones of said current sources and are differentially coupled through output paths to said differential output port;

c) first and second differential pairs of transistors that have offset voltages between control terminals and first current terminals wherein said control terminals are differentially coupled through input paths to said differential input port and said first current terminals are joined at the second ends of respective ones of said level-shift resistors; and d) first and second current-to-voltage converters that each generate at least one correction voltage that substantially matches the offset voltage of one of the transistors of a respective one of said differential pairs when said differential input voltage has one polarity and the offset voltage of another of the transistors when said differential input voltage has a different polarity;

wherein said correction voltage is oriented in at least one of said input paths and said output paths to correct variations in the offset voltages of one of said differential pairs adjacent a polarity transition of said differential input voltage;

and a gray code register responsive to second current terminals of one of the first and second differential pairs of said folding amplifier and responsive to said comparator.

17. The serial analog-to-digital converter of claim 16, further including:

a gray-to-binary converter responsive to said gray code register; and an output register responsive to said gray-to-binary converter.

18. The serial analog-to-digital converter of claim 16, wherein said correction voltage is inserted in at least one of said input paths.

19. The serial analog-to-digital converter of claim 16, wherein said correction voltage is inserted in at least one of said output paths.

20. A K-bit subranging analog-to-digital converter, comprising:

a sampler;

an M-bit serial analog-to-digital converter responsive to said sampler;

an M-bit digital-to-analog converter responsive to said M-bit serial analog-to-digital converter;

a subtracter that responds to said sampler and to said M-bit serial analog-to-digital converter and provides a residue signal;

an N-bit serial analog-to-digital converter responsive to said residue signal; and an output register;

wherein said M-bit serial analog-to-digital converter and said N-bit serial analog-to-digital converter each include:
   a) a sampler;
   b) a comparator; and
   c) at least one unity-gain folding amplifier coupled between said sampler and said comparator in a serial arrangement wherein each folding amplifier has a differential input port and a differential output port and includes:
      a) first and second current sources;
      b) first and second level-shift resistors that have first ends and second ends wherein first ends are coupled to respective ones of said current sources and are differentially coupled through output paths to said differential output port;
      c) first and second differential pairs of transistors that have offset voltages between control terminals and first current terminals wherein said control terminals are differentially coupled through input paths to said differential input port and said first current terminals are joined at the second ends of respective ones of said level-shift resistors; and
      d) first and second current-to-voltage converters that each generate at least one correction voltage that substantially matches the offset voltage of one of the transistors of a respective one of said differential pairs when said differential input voltage has one polarity and the offset voltage of another of the transistors when said differential input voltage has a different polarity;
   wherein said correction voltage is oriented in at least one of said input paths and said output paths to correct variations in the offset voltages of one of said differential pairs adjacent a polarity transition of said differential input voltage;

and wherein, for each of said M-bit serial analog-to-digital converter and said N-bit serial analog-to-digital converter, said output register is responsive to second current terminals of one of the first and second differential pairs of said folding amplifier and responsive to said comparator.

21. The subranging analog-to-digital converter of claim 20, wherein M+N>K and further including including an error correction logic inserted before said output register.

22. The subranging analog-to-digital converter of claim 16, wherein said correction voltage is inserted in at least one of said input paths.

23. The subranging analog-to-digital converter of claim 16, wherein said correction voltage is inserted in at least one of said output paths.

24. The subranging analog-to-digital converter of claim 16, further including a linear amplifier inserted to amplify said residue signal.

* * * * *